(12) United States Patent
Yang et al.

(10) Patent No.: US 9,548,135 B2
(45) Date of Patent: Jan. 17, 2017

(54) METHOD AND APPARATUS FOR DETERMINING STATUS ELEMENT TOTAL WITH SEQUENTIALLY COUPLED COUNTING STATUS CIRCUITS

(71) Applicant: Macronix International Co., Ltd., Hsinchu (TW)

(72) Inventors: Yih-Shan Yang, Hsinchu (TW); Shou-Nan Hung, Zhubei (TW); Chun-Hsiung Hung, Hsinchu (TW); Yao-Jen Kuo, Tainan (TW); Meng-Fan Chang, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 122 days.

(21) Appl. No.: 14/055,656

(22) Filed: Oct. 16, 2013

(65) Prior Publication Data
US 2014/0258794 A1 Sep. 11, 2014

Related U.S. Application Data

(60) Provisional application No. 61/775,728, filed on Mar. 11, 2013.

(51) Int. Cl.
*G11C 29/00* (2006.01)
*G06F 11/07* (2006.01)
(Continued)

(52) U.S. Cl.
CPC ............. *G11C 29/022* (2013.01); *G06F 11/08* (2013.01); *G11C 16/26* (2013.01); *G11C 29/00* (2013.01);
(Continued)

(58) Field of Classification Search
CPC ... G11C 16/3454; G11C 16/349; G11C 29/44; G06F 11/08; G06F 15/16; G06F 11/0751
(Continued)

(56) References Cited

U.S. PATENT DOCUMENTS 4,161,787 A 7/1979 Groves et al.
4,456,995 A 6/1984 Ryan
(Continued)

FOREIGN PATENT DOCUMENTS

CN 1274159 C 9/2006

OTHER PUBLICATIONS

Office Action dated Feb. 12, 2016 in U.S. Appl. No. 14/486,963, 28 pages.

*Primary Examiner* — Phung M Chung
(74) *Attorney, Agent, or Firm* — Haynes Beffel & Wolfeld LLP

(57) ABSTRACT

Counting status circuits are electrically coupled to corresponding status elements. The status elements selectably store a bit status of a bit line coupled to a memory array. The bit status can indicate one of at least pass and fail. The counting status circuits are electrically coupled to each other in a sequential order. Control logic causes processing of the counting status circuits in the sequential order to determine a total of the memory elements that store the bit status. The total number of memory elements that store the bit status indicate the number of error bits or non-error bits, which can help determine whether there are too many errors to be fixed by error correction codes.

18 Claims, 12 Drawing Sheets

(51) Int. Cl.
  *G11C 29/02* (2006.01)
  *G06F 11/08* (2006.01)
  *G11C 29/42* (2006.01)
  *G11C 29/44* (2006.01)
  *G11C 16/26* (2006.01)

(52) U.S. Cl.
  CPC .............. *G11C 29/42* (2013.01); *G11C 29/44* (2013.01); *G11C 2216/14* (2013.01)

(58) Field of Classification Search
  USPC .......................................... 714/704; 365/200
  See application file for complete search history.

(56) References Cited

U.S. PATENT DOCUMENTS

| | | | |
|---|---|---|---|
| 4,856,035 A * | 8/1989 | Lewis ................... | H03K 3/037 377/116 |
| 5,233,614 A * | 8/1993 | Singh .................. | G06F 11/1044 714/702 |
| 5,841,379 A | 11/1998 | Seshan et al. | |
| 6,735,726 B2 * | 5/2004 | Muranaka et al. ........... | 714/708 |
| 6,930,931 B2 * | 8/2005 | Matsuo ................... | G06F 9/325 365/189.12 |
| 7,099,213 B2 | 8/2006 | Ju | |
| 7,134,064 B2 | 11/2006 | Kim | |
| 7,167,409 B2 * | 1/2007 | Akiyoshi ............... | G11C 5/063 365/189.02 |
| 7,778,091 B2 | 8/2010 | Park et al. | |
| 7,952,958 B2 * | 5/2011 | Yanagidaira et al. ... | 365/233.19 |
| 8,839,073 B2 * | 9/2014 | Cohen .......................... | 714/763 |
| 2005/0286308 A1 | 12/2005 | Nagashima | |
| 2006/0139386 A1 | 6/2006 | Silverbrook et al. | |
| 2012/0314504 A1 | 12/2012 | Komai | |

* cited by examiner

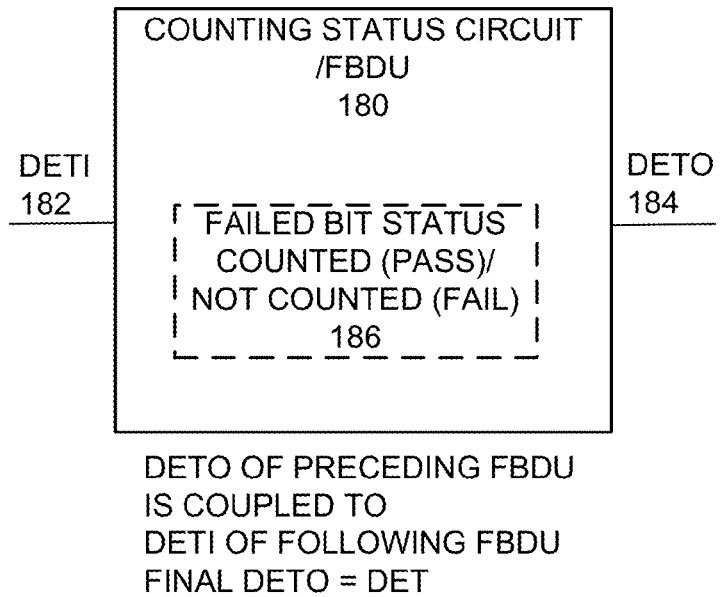
Fig. 5
DETO OF PRECEDING FBDU
IS COUPLED TO
DETI OF FOLLOWING FBDU
FINAL DETO = DET
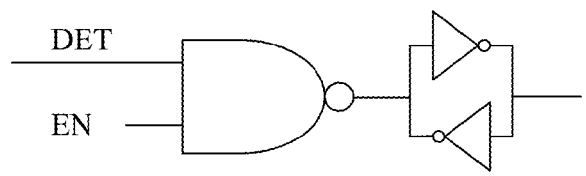
Fig. 6
First Step: DET propagation
RESET = 0
| DETI | FBDU | DETO |
|---|---|---|
| X | PASS | =DETI |
| 1 | FAIL | 0 |
| 0 | FAIL | 0 |
Fig. 7
Second Step: FBDU Reset
RESET = 1
| FBDU | DETO |
|---|---|
| PASS | =DETI |
| PASS | 1 |
| FAIL | 0 |
Fig. 8

| | FBDU1 | FBDU2 |
|---|---|---|
| Verify result | Pass | Fail |

Waveform for 1st FBDU with Fail Data

METHOD AND APPARATUS FOR DETERMINING STATUS ELEMENT TOTAL WITH SEQUENTIALLY COUPLED COUNTING STATUS CIRCUITS

RELATED APPLICATION

This application claims the benefit of U.S. Provisional Patent Application No. 61/775,728, filed 11 Mar. 2013, incorporated herein by reference.

BACKGROUND

Field of the Invention

This technology relates to page buffer output, and more particularly relates to counting errors in page buffer output.

Description of Related Art

As technology shrinks, the random defects of memory cells increase, for example, open bit-line contacts in a NAND Flash array. This kind of defect can be either repaired with redundant cells, or tolerated if the number of defects is limited during a program or erase operation. If tolerated, the total number of defects for both erase and program operations in one page should be less than the ECC number requirement for each page, so that the ECC in read operation can fix the errors from the defects. If tolerated, also the page buffer counts the number of the error bits during program and erase verify operations.

FIG. 1 is a simplified circuit diagram of a circuit that measures a number of errors in page buffer output. The circuit of FIG. 1 is fast but not accurate, as follows.

The page buffer output status latches 12, 14, 16, 18, 20, and 22 indicate whether a corresponding page buffer output status bit has a bit status. In one example, the bit status indicates an error status of a corresponding bit line, such as one of at least pass and fail. The page buffer output status latches 12 and 22 have the failed bit status, and output the high value. The page buffer output status latches 14, 16, 18, and 20 have a pass bit status, and output the low value. The value of the page buffer output status latches is coupled to a corresponding Fail Bit Detection Unit (FBDU).

FBDU circuits 24, 26, 28, 30, 32, and 34 are coupled to a corresponding one of the page buffer output status latches 12, 14, 16, 18, 20, and 22. An FBDU includes two serially connected NMOS transistors. In each FBDU, one of the two serially connected NMOS transistors has a gate coupled to signal VNC 36 which enables all of the FBDU circuits 24, 26, 28, 30, 32, and 34. In each FBDU, the other one of the two serially connected NMOS transistors has a gate coupled to a corresponding one of the page buffer output status latches 12, 14, 16, 18, 20, and 22; this serially connected NMOS transistor is turned on when the corresponding one of the page buffer output status latches has a failed bit status, and turned off otherwise. Transistors other than MOS may be used.

Supply voltage VDD 40 provides current of $(N+\frac{1}{2})*I$ through PMOS VPC 38, where N is the maximum number of failed bits that can be indicated by the page buffer output status latches; in some cases N can be the maximum number of error bits which can be repaired via error correction. For each page buffer output status latch with a bit status failure, the corresponding FBDU sinks "I" current. K failures in the page buffer output status latches sink a total current of K*I. The difference between the supplied and sunk currents is $(N-K+\frac{1}{2})*I$, which flows into the DET input terminal of the NAND gate 42.

NAND gate 42 also has another, EN input and an output coupled to latch 44, which in turn has an output of PASS or FAIL.

The output is as follows:

$K<(N+\frac{1}{2}) \rightarrow Pass$ $K>(N+\frac{1}{2}) \rightarrow Fail$

The circuit of FIG. 1 is fast, because of simultaneous detection of all page buffer output status latches of the page buffer. Disadvantage of the circuit of FIG. 1 include:

i) The sunk current is from a current mirror.

ii) Mismatches among the transistors impact the current accuracy.

iii) When N is large, there is a small difference in the input currents at the DET input terminal between a PASS result and a FAIL result, which impacts the detection accuracy.

FIG. 2 is a simplified circuit diagram of a circuit that detects the position of an error in page buffer output through binary search. The circuit of FIG. 2 is accurate but not fast, as follows.

Each page buffer output status latch is coupled to a corresponding instance of the "FBDU" circuit of FIG. 2 including a latch 48, which can be individually selected via SELECT signal 52, individually reset via the RESET signal 50, and loaded via LOAD signal 46. All of the "FBDU" circuits are coupled to the same DET output 54.

Signal SELECT 52 is the decoded address signal. If the address is selected, the SELECT value is "H"; and if the address is not selected, the SELECT value is "L".

In the first step, the LOAD signal value is "H" and the failure status information is loaded from the corresponding page buffer output status bit to the latch 48.

The second step begins the process of detecting the failure status bit. First all addresses are selected, such that any failure status bit pulls down the DET signal 54 to 0. If the DET signal 54≠1, then at least one failure status bit exists. Then in a binary search, the failure address is located. Then the bit status of the located FBDU is reset, and the failure count is incremented.

Finally, the second step is repeated, until no failure is found when all addresses are selected, such that the DET signal 54=1.

Because the circuit of FIG. 2 counts failure status bits on a digital logic-like basis, the circuit of FIG. 2 is very accurate. However, for N address bits (representing $2^N$ addresses), each failure status bit requires checking the logic N+1 times for each failure due to the binary search for each failure status bit. Such a repeated search is time consuming.

FIG. 3 is a schematic of different steps in a process of detecting the position of an error in page buffer output through binary search, showing the contents of the memory elements in the multiple stages of the circuit series that counts the number of errors in page buffer output, and the output value of the last stage of the circuit series.

A different FBDU with its own latch is represented by each of the columns 56, 58, 60, 62, 64, 66, 68, and 70. The latches are initialized by corresponding page buffer output status bits. The first row 72 shows that the FBDUs of columns 56 and 66 are initialized to a failure status, and that the rest of the FBDUs are not.

Rows 74, 76, 78, and 80 are steps in a binary search for the first FBDU with a latch initialized to a failure status. In each case, the DET signal=0, so a failure bit is located among the selected FBDUs. In row 82, after a failure bit has been localized to the FBDU of column 56, the latch of FBDU of column 56 undergoes a RESET signal. In future searches, the FBDU of column 56 will not cause the DET signal to fall to 0, and the total of failure bits is incremented by 1.

The binary search process for FBDUs with a latch holding the failure status bit continues, because the prior search iteration concluded with DET=0. Row 82 shows that the FBDU of column 66 holds a failure status, and that the rest of the FBDUs are not.

Rows 86, 88, 90, and 92 are steps in a binary search for the next FBDU with a latch holding a failure status. In rows 86 and 90, the DET signal=0, so a failure bit is located among the selected FBDUs. In rows 88 and 92, the DET signal=1, so a failure bit is not located among the selected FBDUs, indicating that the FBDU with the latch holding the failure status was among the unselected FBDUs. In row 94, after a failure bit has been localized to the FBDU of column 66, the latch of FBDU of column 66 undergoes a RESET signal. In future searches, the FBDU of column 66 will not cause the DET signal to fall to 0, and the total of failure bits is incremented by 1.

In row 98, the final iteration begins again with all FBDUs selected. Because DET=1, none of the FBDUs includes a latch holding a failure status. The total of failure bits is not incremented anymore, and holds the final total of FBDUs with a latch initialized to a failure status.

The circuit of FIG. 2 following the process of FIG. 3 is slow but accurate.

It would be desirable to measures a number of errors in page buffer output both quickly and accurately.

SUMMARY

One aspect of the technology is a detecting circuit, comprising a plurality of counting circuits and control logic.

The plurality of counting status circuits are electrically coupled to corresponding ones of a plurality of status elements. The plurality of counting status circuits are electrically coupled to each other in a sequential order.

The control logic causes processing of the plurality of counting status circuits in the sequential order to determine a total of the plurality of status elements.

One aspect of the technology is a memory circuit, comprising counting status circuits and control logic.

The counting status circuits are electrically coupled to corresponding bit status memory elements. The bit status memory elements store a bit status of a bit line, which can be pass or fail. The counting status circuits are electrically coupled to each other in a sequential order.

The control logic cause processing of the counting status circuits in the sequential order to determine a total of the memory elements that store the bit status. The total number of memory elements that store the bit status indicate a number of error bits or non-error bits, which can help determine whether there are too many errors to be fixed by error correction codes.

Another aspect of the technology is a method of operating memory.

The method includes:
  processing a plurality of counting status circuits in a sequential order to determine a total of a plurality of memory elements that store a bit status of one of a plurality of bit lines of a memory array, the bit status indicating one of at least pass and fail, the plurality of counting status circuits electrically coupled to each other in the sequential order,
  wherein the plurality of counting status circuits receive data from corresponding ones of a plurality of bit status memory elements coupled to the plurality of bit lines of the memory array.

One embodiment further includes a page buffer with page buffer output bits storing memory array output. The page buffer output bits include the corresponding page buffer output bits providing the bit status to one of the plurality of memory elements.

In one embodiment, the counting status circuits have corresponding counting status memory elements. The corresponding counting status memory elements indicate whether the bit status of the bit status memory elements has been counted in the total of the memory elements that store the bit status.

In one embodiment, initial contents of the corresponding counting status memory elements are determined by the corresponding page buffer output bits of the page buffer. For example, if the corresponding page buffer output bits of a page buffer indicate a failed bit status, then the initial contents of the corresponding counting status memory elements indicate a failed bit status. In one embodiment, the bit status in one of the bit status memory elements indicates a one of at least pass and fail of one of the bit lines.

In one embodiment, each of the plurality of counting status circuits includes one of the plurality of bit status memory elements. The bit status memory element could be located outside of the counting status circuit, although at the cost of additional latency.

In one embodiment, the processing of the counting status circuits in the sequential order, is interrupted from proceeding further in the sequential order, by one of the counting status circuits having a corresponding counting status memory element which indicates that the bit status of at least one of the bit status memory elements has not been counted in the total of the memory elements that store the bit status.

In one embodiment, after the processing of the counting status circuits in the sequential order is interrupted, and before subsequent processing of the counting status circuits in the sequential order from a beginning of the sequential order, contents of the corresponding counting status memory element is changed by the control circuitry, to indicate that the bit status of at least one of the bit status memory elements has been counted in the total of the memory elements that store the bit status. Consequently, on a subsequent occasion, during processing of the counting status circuits in the sequential order, the same counting status circuit which caused interruption of the processing in the prior iteration will not cause interruption of the processing in subsequent iterations.

In one embodiment, the processing of the counting status circuits in the sequential order, is successful in proceeding through all of the sequential order, responsive to none of the counting status circuits having a corresponding counting status memory element which indicates that the bit status of one of the bit status memory elements has not been counted in the total of the memory elements that store the bit status. One possible cause is that, upon initialization, none of the counting status memory elements indicates the failed bit status of one of the bit status memory elements. Another possible cause is that, although upon initialization, one or more of the counting status memory elements did indicate the failed bit status of one of the bit status memory elements, prior processing resulted in counting status memory elements changing their contents to indicate that the failed bit status of all of the bit status memory elements has been counted.

In one embodiment, the control circuitry causes repetition of the processing of the counting status circuits in the sequential order, at least until none of the of counting status circuits has a corresponding counting status memory element which indicates that the bit status of one of the bit status memory elements has not been counted in the total of the memory elements that store the bit status.

BRIEF DESCRIPTION OF THE DRAWINGS

FIG. 5 is a simplified block diagram of a stage of the circuit series that counts the number of errors in page buffer output.

FIG. 6 is a simplified circuit diagram of a circuit coupled to the output of the last of the circuit series shown in FIG. 5 that counts the number of errors in page buffer output.

FIG. 7 is a truth table that shows the output of varied inputs of the stage of the circuit series shown in FIG. 5.

FIG. 8 is a truth table that shows whether the contents of a memory element of the stage of a circuit series shown in FIG. 5 changes in response to the state of the input and output of the stage of the circuit series shown in FIG. 5.

DETAILED DESCRIPTION

Figure 4:
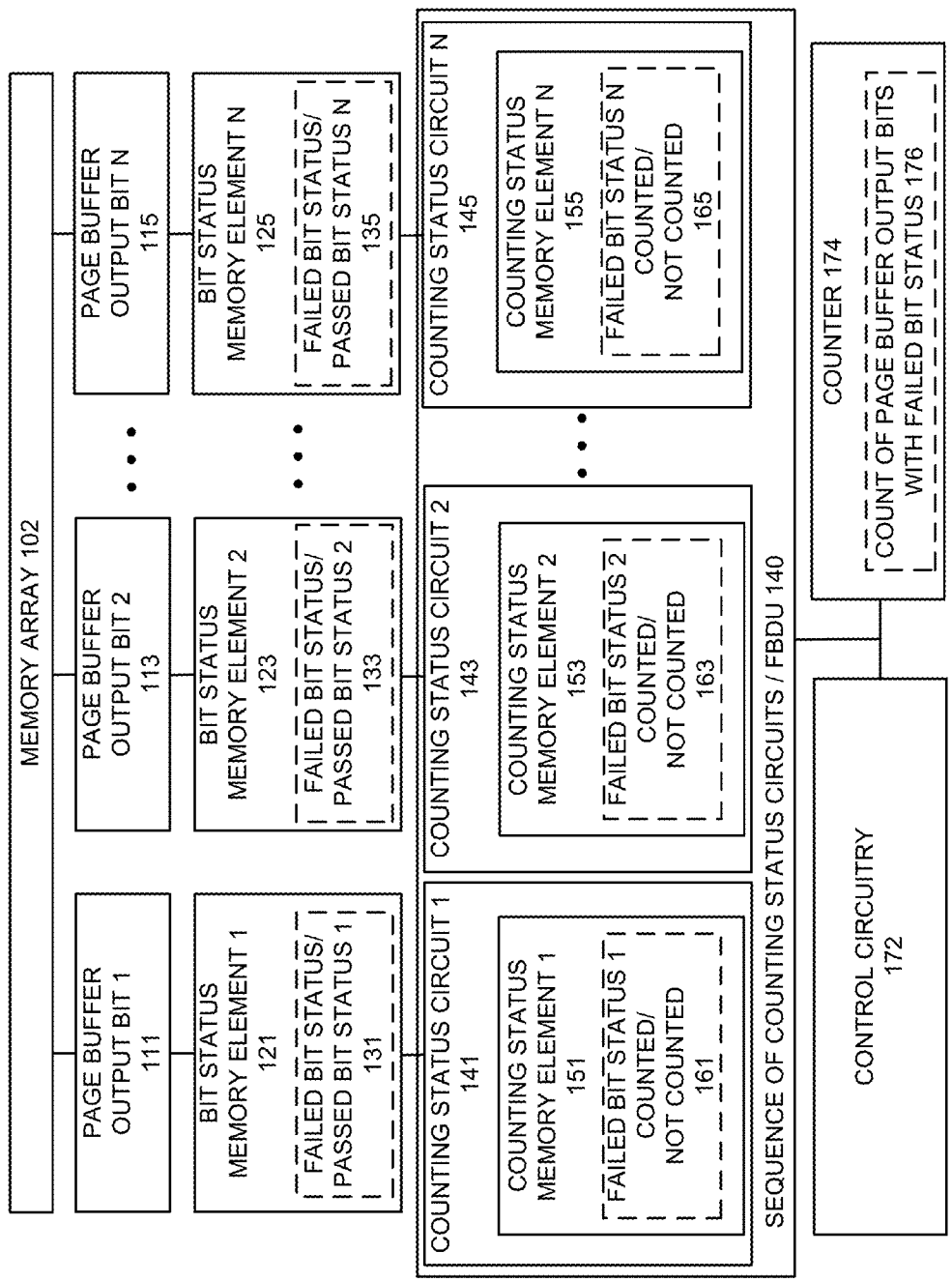
FIG. 4 is a simplified circuit diagram of a circuit that counts the number of errors in page buffer output.

FIG. 4 is a simplified circuit diagram of a circuit that counts the number of errors in page buffer output bits 111, 113, and 115.

Output bits are read from bit lines of a memory array 102. Page buffer circuitry determines whether the page buffer output bits 111, 113, and 115 are characterized by a failure status, for example via a verify circuit (not shown), such as FIG. 6 of U.S. Pat. No. 7,952,958, all of which is incorporated by reference. The failure status of page buffer output bits 111, 113, and 115 is stored in corresponding bit status/ memory elements 121, 123, and 125.

The counting status circuits 141, 143, and 145 include respective counting status memory elements 151, 153, and 155. The counting status memory elements 151, 153, and 155 respectively store the failed bit status counted or not counted 161, 163, and 165. The failed bit status counted or not counted 161, 163, and 165 are initialized by respective failed bit status or passed bit status 131, 133, and 135. As the counting proceeds, each failed bit status not counted is changed to a failed bit status counted, and the count of page buffer output bits with failed bit status 176 is incremented by the counter 174. After every failed bit status not counted has been changed to failed bit status counted, then the sequence of FBDUs, or counting status circuits, finishes counting. The overall process is managed by the control circuitry 172.

FIG. 5 is a simplified block diagram of a stage of the circuit series that counts the number of errors in page buffer output.

The FBDU 180, or counting status circuit 180, has an input signal DETI 182, and an output signal DETO 184. The FBDU 180 stores the failed bit status counted (pass)/not counted (fail) 186; this bit is stored to the latch at the beginning of the detection phase. Multiple FBDUs are coupled in series, each FBDU corresponding to a particular page buffer output bit. The output signal DETO 184 of a preceding FBDU is coupled to the input signal DETI 182 of a following FBDU. The output signal DETO of the final DETO is signal DET.

When the failed bit status is not counted (fail), then the switch is off, and the path through the series of FBDUs is cut off, indicating an uncounted fail bit, which results in incrementing the fail bit count by 1. When the failed bit status is counted (pass), then the switch is on, and the path through the series of FBDUs continues to the subsequent FBDU in the series of FBDUs.

FIG. 6 is a simplified circuit diagram of a circuit coupled to the output of the last of the circuit series shown in FIG. 5 that counts the number of errors in page buffer output.

The output of the last FBDU in the series, such as the FBDU shown in FIG. 5, has an output signal DET which is an input to the NAND gate. Another input of the NAND gate is an enable EN signal. The output of the NAND gate is coupled to a latch.

FIG. 7 is a truth table that shows the output of varied inputs of the stage of the circuit series shown in FIG. 5.

Each detection operation includes two steps. FIG. 7 shows the first step of the propagation of the DET signal. At this step, RESET signal is 0V and FBDU keeps the previous bit status. The second step is the FBDU reset step. At this step, the first FBDU with a failed bit status is reset. All other FBDUs remain their bit status. The DET signal changes and propagates again until reaching the second FBDU with failed bit status.

For the FBDU storing the value of the passed bit status, the output signal DETO passes through the input signal DETI. For the FBDU storing the value of the failed bit status, output signal DETO=0 occurs at the first step.

FIG. 8 shows the second step. After the RESET goes high, the first FBDU with failed bit status (DETI=1 in the first step) is reset, FAIL status is changed to PASS status for this FBDU, and the output signal DETO passes through the input signal DETI. For other FBDUs, the bit status is unchanged.

Figure 9:
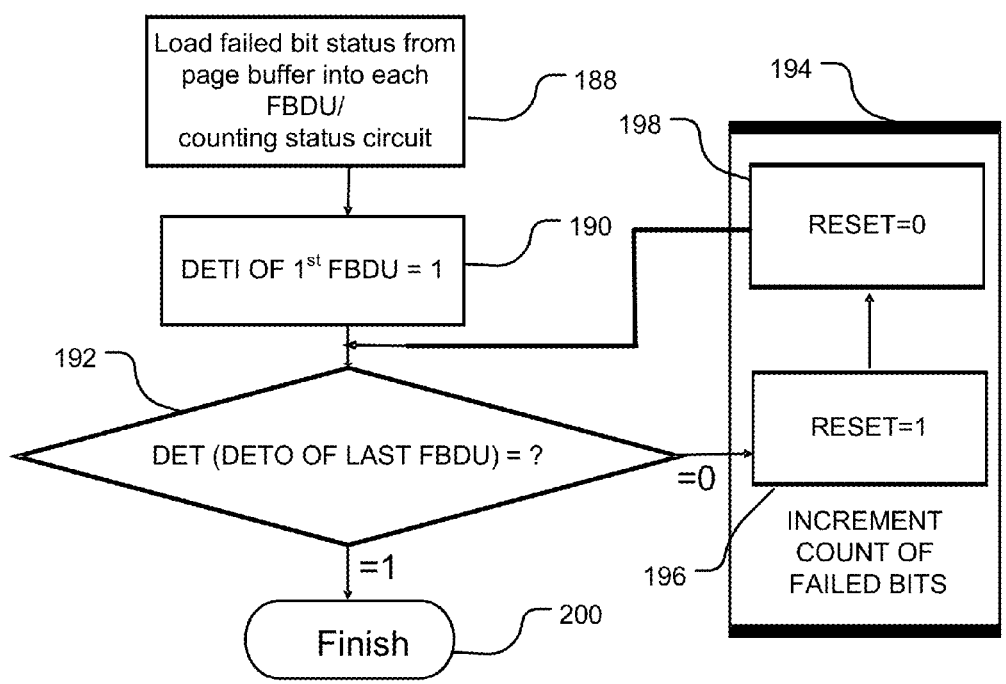
FIG. 9 is a process flow of counting the number of errors in page buffer output, with the circuit of FIG. 4.

FIG. 9 is a process flow of counting the number of errors in page buffer output, with the circuit of FIG. 4.

In 188, the failed bit status from the page buffer output is used to initialize the series of FBDU/counting status circuits. In 190, the input of the first FBDU is set to 1. The DET signal chain will be stopped by any FBDU in the series of FBDU/counting status circuits stores a failed bit status not counted (fail). In 192, the first FBDU in the series causes the DET (the output signal of the last FBDU in the series) to =0, and the process proceeds to 194. In 194, the counter of failed bits is incremented by one, followed by the input signal RESET=1 196, and then the input signal RESET=0 198.

However, the DET signal chain is not stopped if any FBDU in the series of FBDU/counting status circuits stores a failed bit status counted (pass). In 192, the first FBDU in the series causes the DET (the output signal of the last FBDU in the series) to =1, and the process proceeds to 200, "Finish". At 196, at least one FBDU is reset by the reset signal and the fail count is incremented. The DET signal chain is transferred and stopped at the next FBDU with fail bit data. The procedure continues until DET (the output signal of the last FBDU in the series)=1.

The present process flow is advantageous because of an accurate count of failed bits, a low total of two operations for counting each instance of a failed bit, and a low timing overhead for each failed bit. As a result, more failed bit can be counted in a given period of time during the program verify and erase verify operation.

Figure 10:
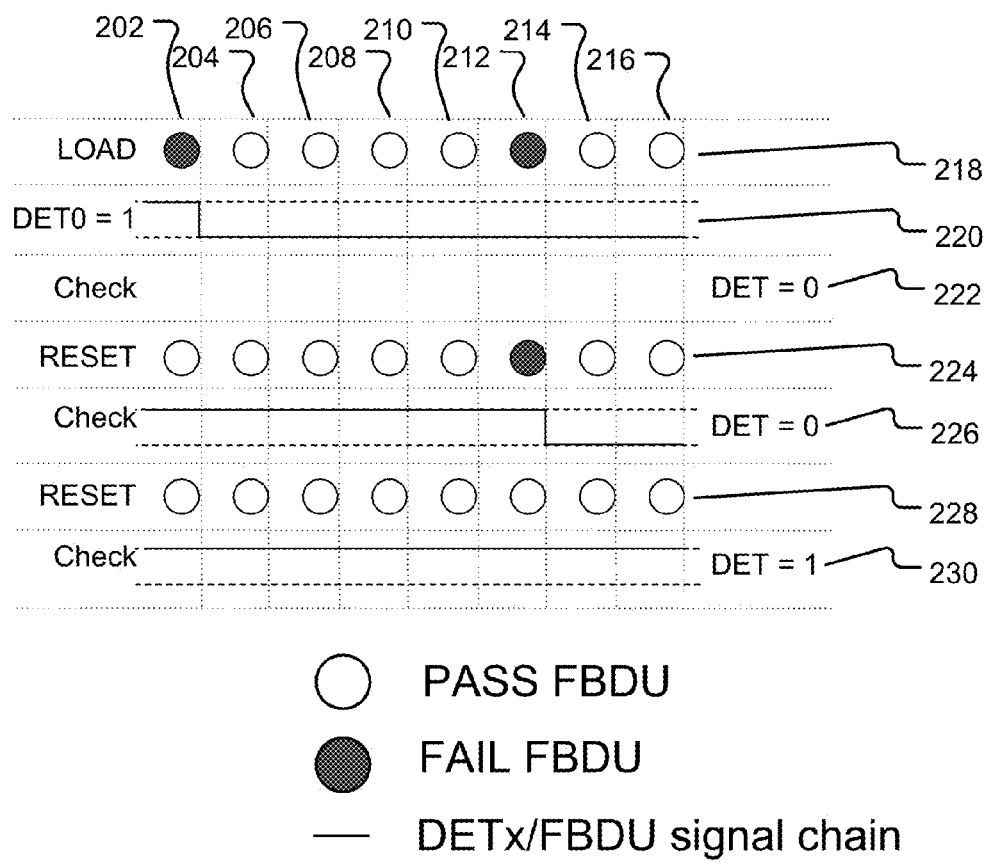
FIG. 10 is a schematic of different steps in a process of counting the number of errors in page buffer output, showing the contents of the memory elements in the multiple stages of the circuit series that counts the number of errors in page buffer output, and the output value of the last stage of the circuit series.

FIG. 10 is a schematic of different steps in a process of counting the number of errors in page buffer output, showing the contents of the memory elements in the multiple stages of the circuit series that counts the number of errors in page buffer output, and the output value of the last stage of the circuit series.

A different FBDU with its own latch is represented by each of the columns 202, 204, 206, 208, 210, 212, 214, and 216. The failed bit status memory elements (such as latches) are initialized by corresponding page buffer output status bits. The first row 218 shows that the FBDUs of columns 202 and 212 are initialized to a failure status, and that the rest of the FBDUs are not.

Rows 220, 222, 224, 226, 228, and 230 are steps in multiple iterations of counting the number of FBDUs with a latch initialized to a failure status. The iterative process continues if DET=0, and stops if DET=1.

In the first iteration 220, the FBDU of column 202 receives the input of DETI=1, and send the output of DETO=0, which is passed through to the last output of the last FBDU in the series. Because the last output DET=0, the iterative process will continue. The contents of the FBDU of column 202 are reset, so in the following iteration 224, the FBDU of column 202 no longer holds the failed bit status not counted, although the FBDU of column 212 still holds the failed bit status not counted. The counter of failure bits is incremented by one.

In the second iteration 226, the FBDU of column 202 receives the input of DETI=1, which is passed through to the FBDU of column 212. The FBDU of column 212 send the output of DET=0, which is passed through to the last output of the last FBDU in the series. Because the last output DET=0, the iterative process will continue. The contents of the FBDU of column 212 are reset, so in the following iteration 228, the FBDU of column 212 no longer holds the failed bit status not counted, and no FBDU holds the failed bit status not counted. The counter of failure bits is incremented by one.

In the third and last iteration 230, the FBDU of column 202 receives the input of DETI=1, which is passed through to the last output of the last FBDU in the series. Because the last output DET=1, the iterative process is over. The counter of failure bits is not incremented.

Other embodiments have a different number of FBDU circuits coupled in series, typically but not necessarily a power of two or multiple of two.

Figure 11:
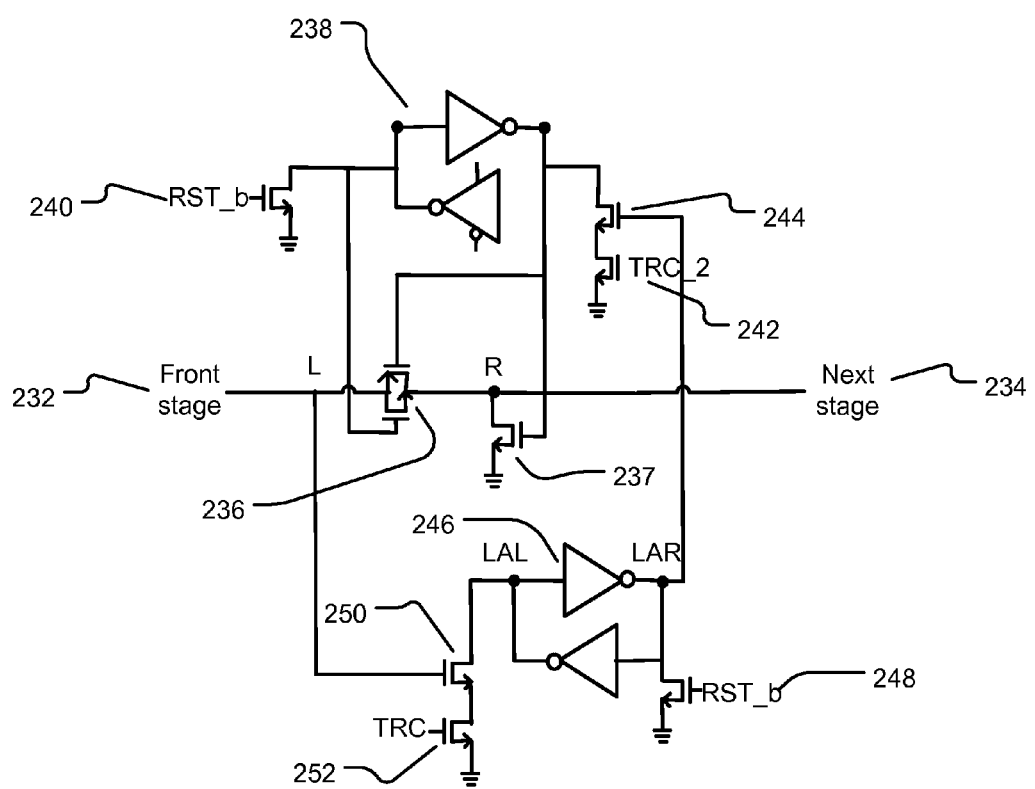
FIG. 11 is a more detailed circuit diagram of the simplified block diagram of FIG. 5 for a stage of the circuit series that counts the number of errors in page buffer output.

FIG. 11 is a more detailed circuit diagram of the simplified block diagram of FIG. 5 for a stage of the circuit series that counts the number of errors in page buffer output.

The corresponding output column of multiple page buffers can share a single FBDU. Multiple FBDUs are coupled in series.

The fail bit detect unit generally includes three blocks: the pass gate 236, the upper latch 238, and the lower latch 246.

The main part is the pass gate 236, which acts as the detecting gate of the contents of the upper latch 238. If the detect result is fail, the pass gate 236 turns off, and transistor 237 passes a result of 0 to the nest stage 234. If the detect result is pass, the pass gate 236 turns on, and the signal from the front stage 232 can be passed to the next stage 234.

If the last FBDU in the series has an output signal of 0, then the failed bit counter increments by one. After the detecting cycle, two input signals (trc 252, trc_2 242) flip the contents of the two latches 238 and 246.

The upper latch 238 stores the pass/fail information from the page buffer which controls the on/off status of the pass gate 236.

If there was only the upper latch 238, then the flip signal would causes not just the upper latch 238 of a particular FBDU, but the upper latch 238 of multiple FBDUs to flip. Accordingly, the lower latch 246 controls the FBDU which includes an upper latch 238 that flips. The lower latch 246 detects the signal from the front stage 232 before the pass gate 236. If the delivery signal (trc 252, trc_2 242) arrives, the lower latch 246 flips first, and enables the flip path of the upper latch 238. TRC 252 is in series with transistor 250 between the lower latch 246 and ground. Transistor 250 has a gate coupled to the front stage 232. TRC 242 is in series with transistor 244 between the upper latch 238 and ground. Transistor 244 has a gate coupled to the lower latch 246. Accordingly, the lower latch 246 addresses the problem of the upper latch 238 of several FBDUs flipping at the same time. RST_b transistors 240 and 246 respectively reset the upper latch 238 and the lower latch 246. trc 252 and trc_2 242 are two non-overlapping pulses such as 310 and 312 in FIG. 14. trc come first then trc_2 comes next.

Figures 12, 13:
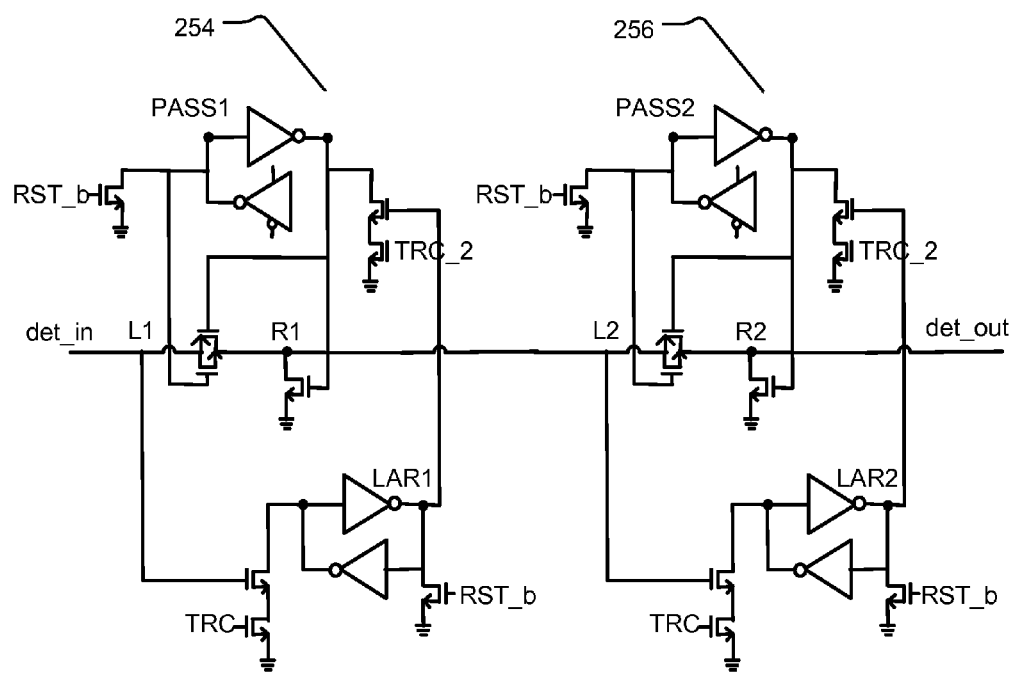
FIG. 12 is an example two-stage circuit series with two instances of the circuit shown in FIG. 11 coupled in series to count the number of errors in page buffer output.
FIG. 13 is an example of contents of the memory elements in the two-stage circuit series shown in FIG. 12.

FIG. 12 is an example two-stage circuit series with two instances 254 and 256 of the circuit shown in FIG. 11 coupled in series to count the number of errors in page buffer output. The output of the prior stage is coupled to the input of the following stage.

FIG. 13 is an example of contents of the memory elements in the two-stage circuit series shown in FIG. 12. FBDU 1 and FBDU 2 are respectively the first FBDU and the second FBDU in FIG. 12.

Figure 14:
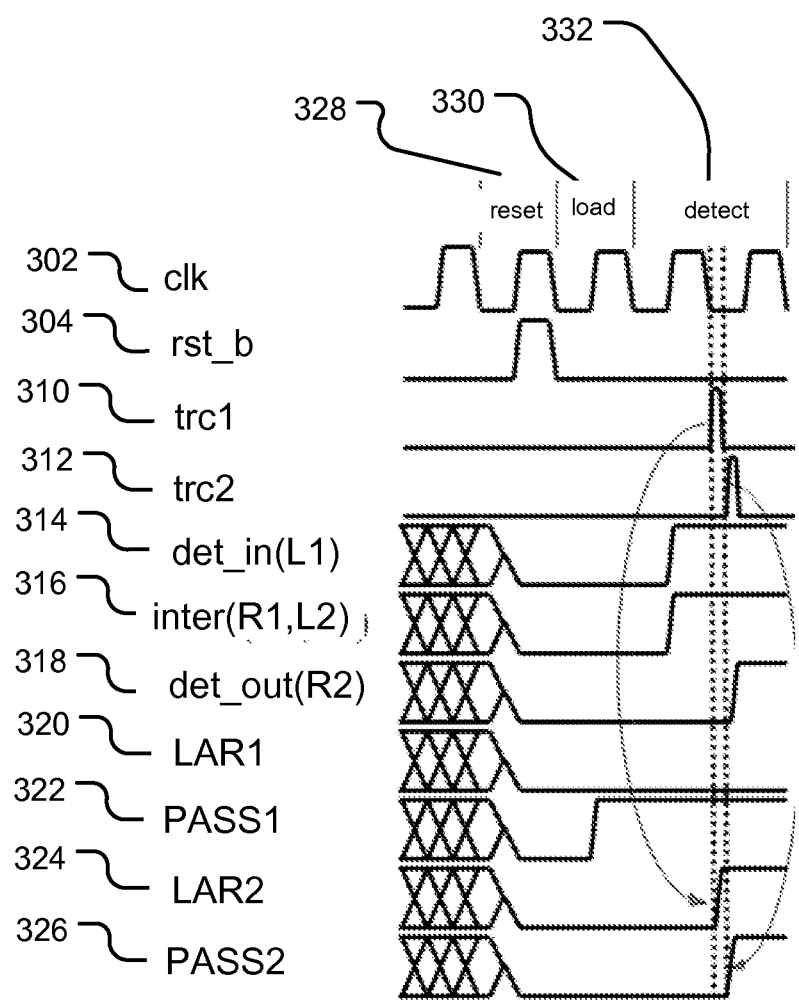
FIG. 14 is a timing diagram of the signals versus time for the circuit in FIG. 12.

FIG. 14 is a timing diagram of the signals versus time for the circuit in FIG. 12.

The traces are: clk 302, rst_b 304, trc 310, trc_2 312, det_in(L1) 314, inter(R1,L2) 316, det_out(R2), LAR1 320, PASS1 322, LAR2 324, and PASS2 326. The traces show the voltage vs. time at nodes shown in FIG. 13.

The periods included are reset 328, load 330, and detect 332.

In the beginning of the detect stage, rst_b 304 resets the circuit and latch.

Load 330 loads the pass/fail information by turning on fbit[0] 306. Then the data (PASS1 322, PASS2 326)=(pass, fail)=(vdd,vss).

After loading the data, det_in 314 starts the detecting signal. In the first unit, the data value is pass, so the pass gate is open, and the DET signal passes through.

In the second unit, the DET signal is blocked, because the pass gate is off; there is no output at det_out 318. At the same time the latch flipping signal (trc 310, trc_2 312) starts to send a pulse every clock cycle.

When the detect signal come to the second unit(inter 316) and the trc 310 signal comes, the lower latch flips. The switched lower latch and the trc_2 signal 312 make the upper latch flip if the upper latch holds a "fail" value. The trc 310 and trc_2 312 do not overlap, to prevent the upper latch of multiple FBDUs flipping at the same time.

The counter increment depends on the det_out every clock cycle if there det_out=0.

After the upper latch of the second FBDU flips (PASS2 326 goes high), the DET signal can be passed through the second FBDU to det_out 318, and the fbit[0] detect is complete.

Then the circuit resets and deals with fbit[1] 308. The same operations follow in general. Because there are two fail bits in this fail bit detecting operation, the path is blocked twice—L1 to R1 in the first FBDU, L2 to R2 in the second FBDU.

The arrow signs in the figure show that the latches are flipped after the trc and trc_2 signals arrive.

Figure 15:
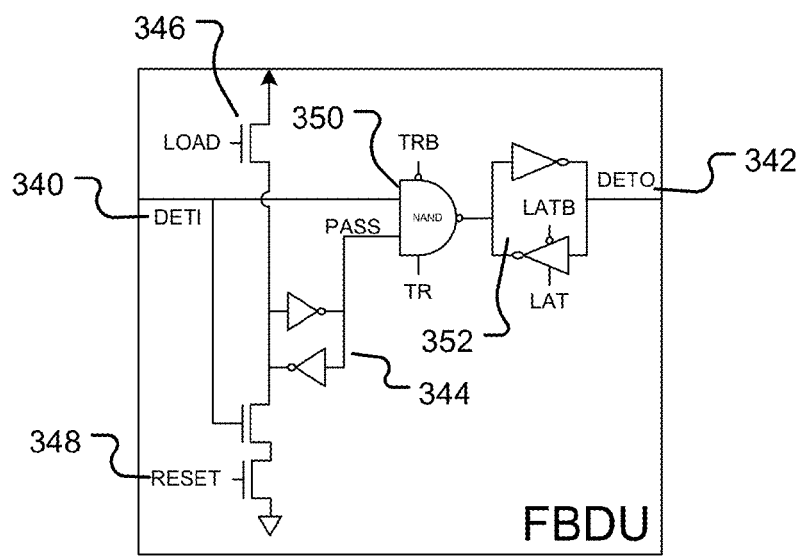
FIG. 15 is a more detailed circuit diagram of alternative to FIG. 11 for the simplified block diagram of FIG. 5 for a stage of the circuit series that counts the number of errors in page buffer output.

FIG. 15 is a more detailed circuit diagram of alternative to FIG. 11 for the simplified block diagram of FIG. 5 for a stage of the circuit series that counts the number of errors in page buffer output.

LOAD transistor 346 initializes latch 344 with the failed bit status from the page buffer. LOAD transistor 346 is in series with a transistor having a gate coupled to the input signal DETI 340 and a RESET transistor 348. Tri-state NAND gate 350 has transfer TR and transferbar TRB signals, as inputs the input signal DETI 340 and the latch 344, and an output coupled to latch 352. The latch 352 has an output provided as output signal DETO 342.

Figure 16:
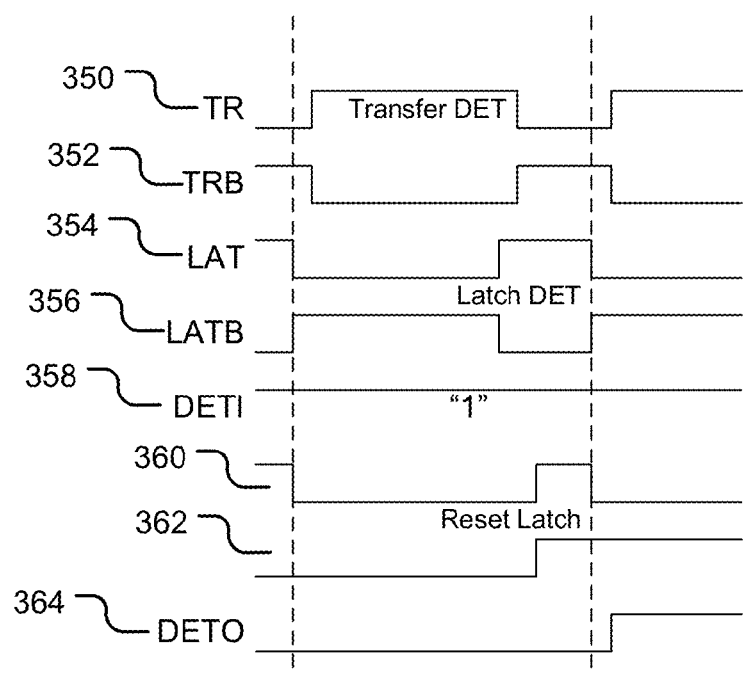
FIG. 16 is a timing diagram of the signals versus time for the circuit in FIG. 15.

FIG. 16 is a timing diagram of the signals versus time for the circuit in FIG. 15.

The traces are: TR 350, TRB 352, LAT 354, LATB 356, DETI 358, 360, 362, and DETO 364. The traces show the voltage vs. time at nodes shown in FIG. 15. Node 360 is RESET, node 362 is PASS. The operations are generally as described for other embodiments.

Signal TRB 352 is the complement of signal TR 350. Signal LATB 356 is the complement of signal LAT 354.

The operations are as follows:

First transfer DET. The DET signal is transferred through FBDU. At this step, TR=1, LAT=0, and RESET=0.

Second, latch DET. The DET signal is latched. LAT=1 first, then TR=0.

Third, reset Fail FBDU. RESET=1 to reset the latch. Then RESET=0 and LAT=0.

Figure 17:
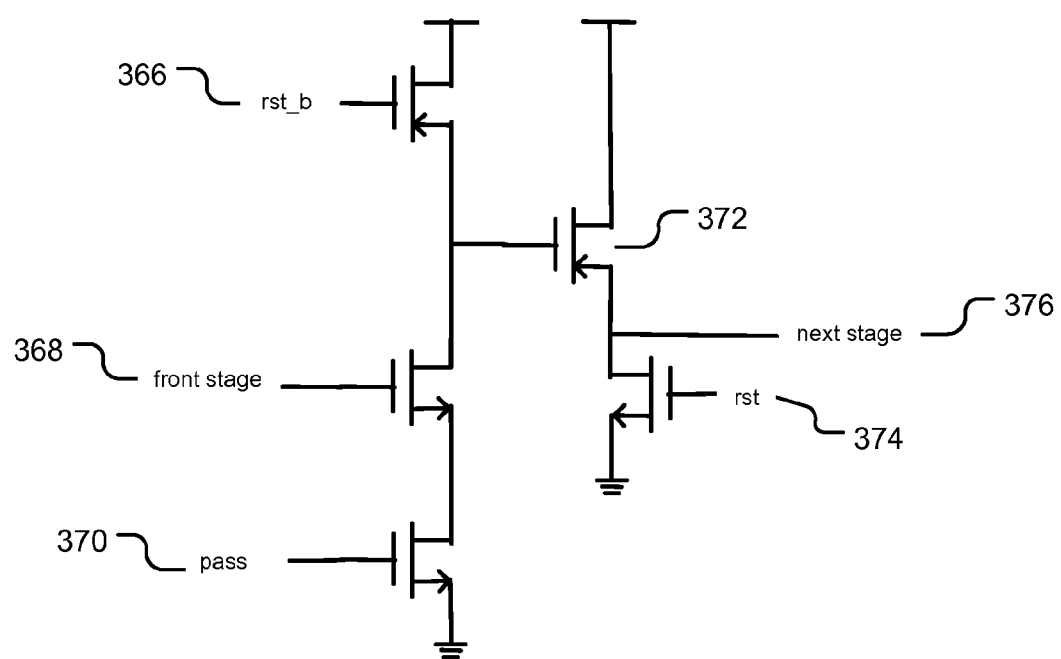
FIG. 17 is a detailed circuit diagram of an alternative to the pass gate in FIG. 11.

FIG. 17 is a detailed circuit diagram of an alternative to the pass gate in FIG. 11.

Various embodiments rely on the control of series-coupled pass gates to selectively pass a signal depending on whether or not a particular page buffer fail status bit has been counted. Embodiments relying solely on the pass gate can result in slow circuit performance. Other embodiments have a buffer type core to replace the pass gate and the reset transistor.

In the buffer type core embodiment of FIG. 17, pass transistor 370 is the gate, front stage transistor 368 catches the front stage signal, and transistor 372 P1 pulls up the next stage. Transistor 372 P1 is the buffer transistor improving performance. The structure of FIG. 17 replaces the "pass gate" part of FIG. 11. The other parts remain the same.

Figure 1:
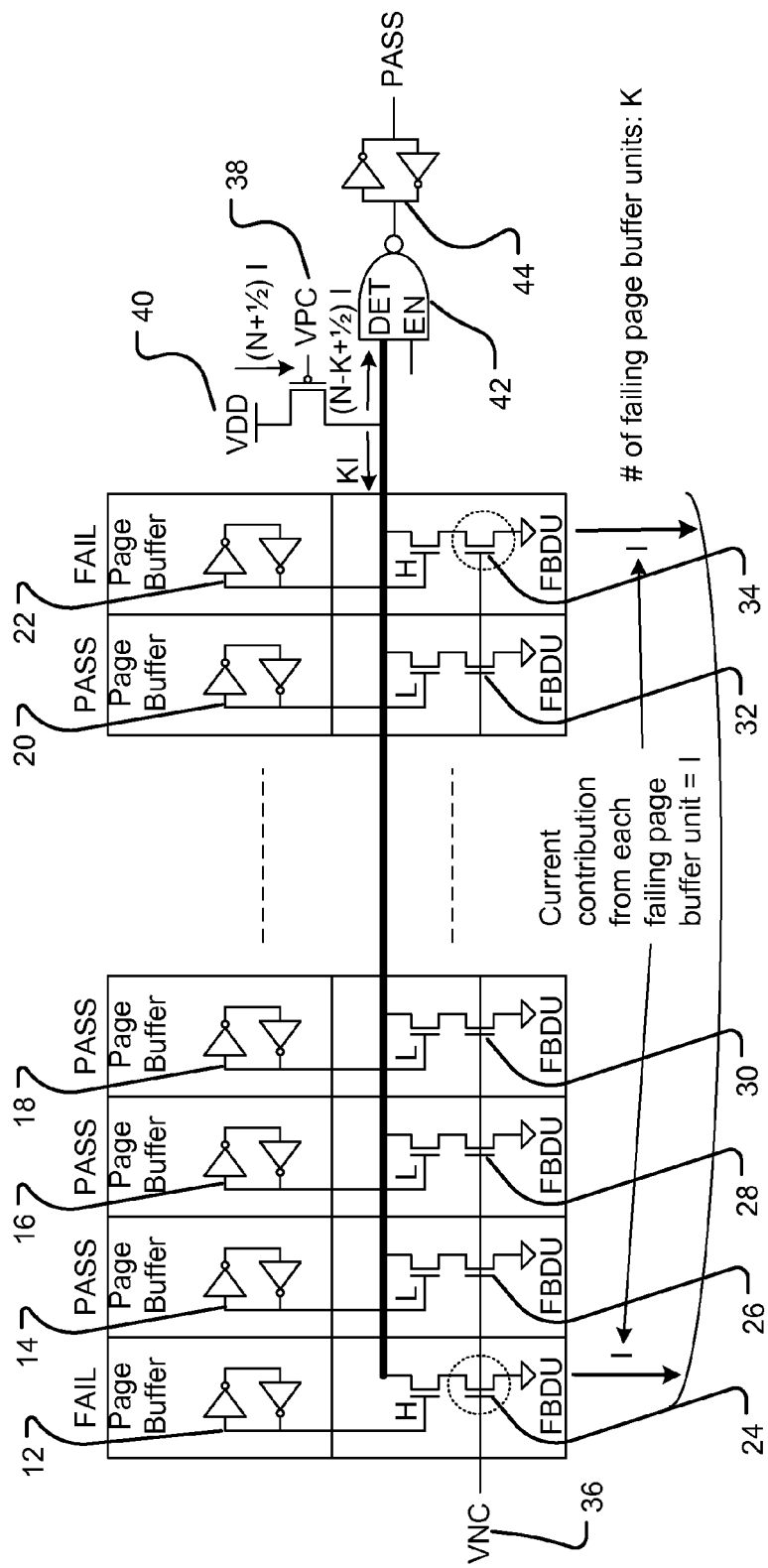
FIG. 1 is a simplified circuit diagram of a circuit that measures a number of errors in page buffer output.
Figure 2:
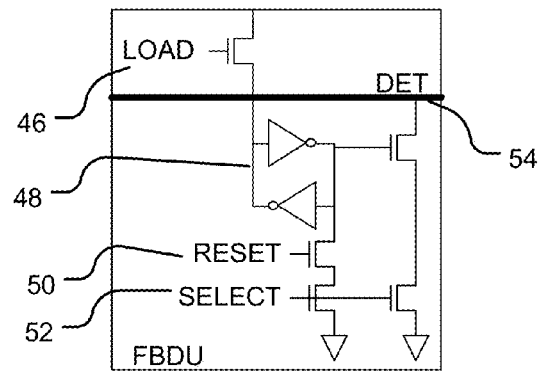
FIG. 2 is a simplified circuit diagram of a circuit that detects the position of an error in page buffer output through binary search.
Figure 3:
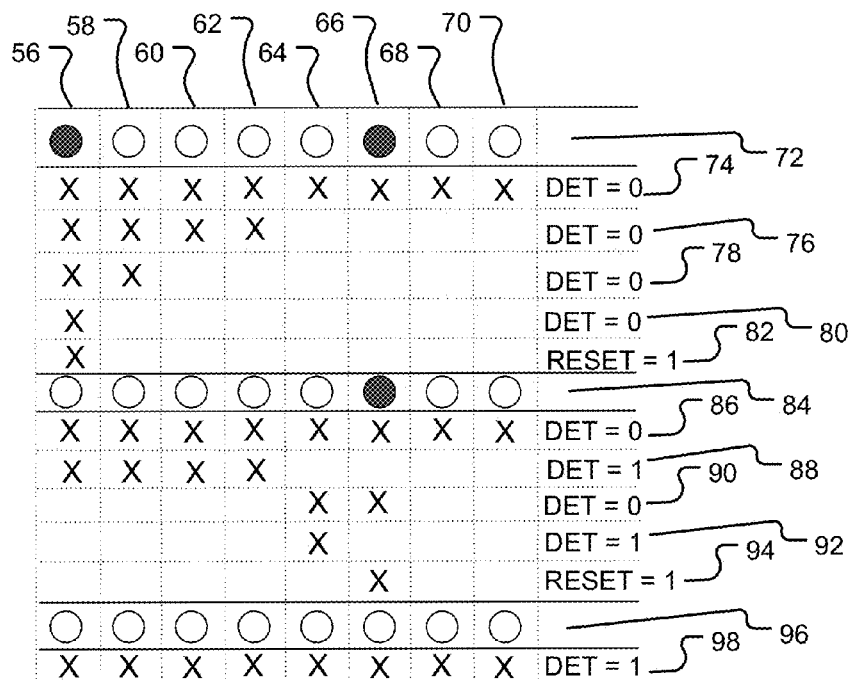
FIG. 3 is a schematic of different steps in a process of detecting the position of an error in page buffer output through binary search, showing the contents of the memory elements in the multiple stages of the circuit series that counts the number of errors in page buffer output, and the output value of the last stage of the circuit series.

This buffer type includes two more transistors than the pass gate type. Combining the two types—pass gate and buffer type—improves the performance. In one example, 7 pass gate types as shown in FIG. 11 and 1 buffer type as shown in FIG. 17 are connected serially, and repeated. In one embodiment, 32 stages with an all pass gate structure cost 30 ns to deliver a signal from beginning to end. However, the structure with both buffer type and pass gate type with a 1:7 ratio, the transfer time reduces to 5 ns. The ratio can be varied in other embodiments.

An all buffer type is faster but has larger area.

Figure 18:
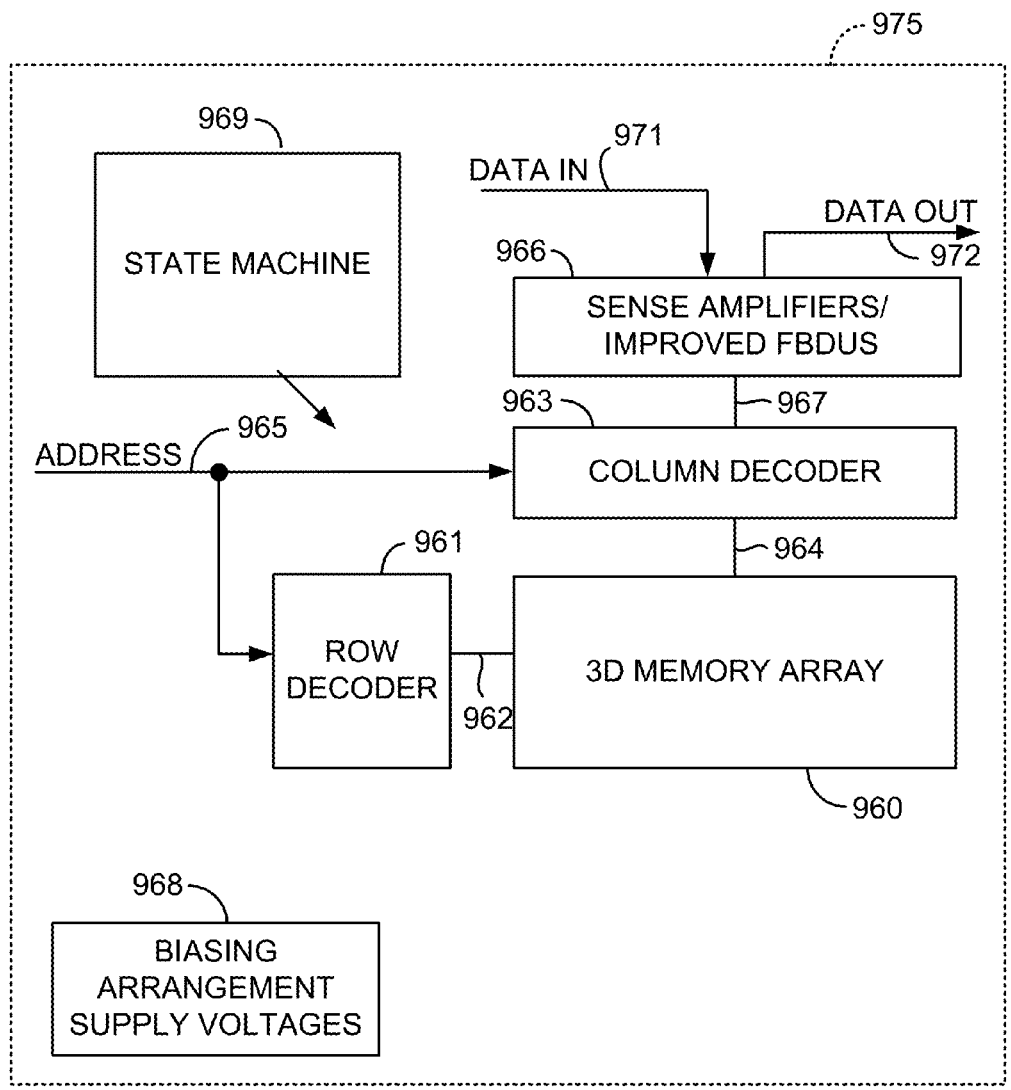
FIG. 18 is a schematic diagram of an integrated circuit including a memory array with improved FBDUs, or counting status circuits.

FIG. 18 is a schematic diagram of an integrated circuit including a memory array with improved FBDUs, or counting status circuits.

The integrated circuit line 975 includes a 3D memory array 960, implemented as described herein. A row decoder 961 is coupled to a plurality of word lines 962, and arranged along rows in the memory array 960. Circuitry 963 includes a plane decoder and a column decoder. The column decoder is coupled to a plurality of bit lines 964 arranged along columns and planes in the memory array 960 for reading data from the memory cells in the array 960. A plane decoder is coupled to a plurality of planes in the memory array 960 via CSL lines for programming data to the memory cells in the array 960. Addresses are supplied on a bus to the plane decoder and the column decoder in circuitry 963 including an improved page buffer with FBDUs as disclosed herein, and row decoder 961. Sense amplifiers and data-in structures in block 966 are coupled to the circuitry 963 in this example via data bus 967. Data is supplied via the data-in line 971 from input/output ports on the integrated circuit 975 or from other data sources internal or external to the integrated circuit 975, to the data-in structures in block 966. In other embodiments, other circuitry is included on the integrated circuit 975, such as a general purpose processor or special purpose application circuitry, or a combination of modules providing system-on-a-chip functionality supported by the memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Various embodiments are directed to a general bit detecting structure with a parallel output.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A detecting circuit, comprising:
a plurality of counting status circuits electrically coupled to corresponding ones of a plurality of status elements, the plurality of counting status circuits electrically coupled to each other in a sequential order,
wherein the plurality of counting status circuits have corresponding counting status memory elements, the corresponding counting status memory elements indicating whether bit statuses of the plurality of status elements have been counted in a total of the plurality of status elements that store the bit statuses, the bit statuses indicating one of at least pass and fail of corresponding ones of a plurality of bit lines coupled to the plurality of status elements; and
control logic causing processing of the plurality of counting status circuits in the sequential order to determine the total of the plurality of status elements.

2. The detecting circuit of claim 1, further comprising:
a page buffer with a plurality of page buffer output bits storing memory array output, the plurality of page buffer output bits providing bit statuses of a plurality of bit lines to one of a plurality of status elements, the bit statuses indicating one of at least pass and fail of corresponding ones of the plurality of bit lines coupled to the plurality of status elements.

3. The detecting circuit of claim 1,
initial contents of the corresponding counting status memory elements are determined by corresponding page buffer output bits of a page buffer.

4. The detecting circuit of claim 1,
wherein each of the plurality of counting status circuits includes one of the plurality of status elements.

5. The detecting circuit of claim 1,
a status indicates one of at least pass and fail in one of the plurality of status elements.

6. The detecting circuit of claim 1,
wherein said processing of the plurality of counting status circuits in the sequential order, is interrupted from proceeding further in the sequential order, by one of the plurality of counting status circuits having the corresponding counting status memory element which indicates that a bit status of at least one of the plurality of status elements has not been counted in the total of a plurality of status elements that store the bit status.

7. The detecting circuit of claim 6,
wherein, after said processing of the plurality of counting status circuits in the sequential order is interrupted, and before subsequent processing of the plurality of counting status circuits in the sequential order from a beginning of the sequential order, contents of the corresponding counting status memory element is changed by the control circuitry, to indicate that a bit status of at least one of the plurality of status elements has been counted in the total of the plurality of status elements that store the bit status.

8. The detecting circuit of claim 1,
wherein said processing of the plurality of counting status circuits in the sequential order, is successful in proceeding through all of the sequential order, responsive to none of the plurality of counting status circuits has the corresponding counting status memory element which indicates that a bit status of at least one of the plurality of status elements has not been counted in the total of the plurality of status elements that store the bit status.

9. The detecting circuit of claim 1,
wherein the control circuitry causes repetition of said processing of the plurality of counting status circuits in the sequential order, at least until none of the plurality of counting status circuits has the corresponding counting status memory element which indicates that a bit status of one of the plurality of status elements has not been counted in the total of the plurality of status elements that store the bit status.

10. A method of detection, comprising:
processing a plurality of counting status circuits in a sequential order to determine a total of a plurality of status elements, the plurality of counting status circuits electrically coupled to each other in the sequential order,
wherein the plurality of counting status circuits receive data from corresponding ones of the plurality of status elements; and
indicating, with corresponding counting status memory elements of the plurality of counting status circuits, whether statuses of the plurality of status elements have been counted in the total of the plurality of status elements, the statuses of the plurality of status elements indicating one of at least pass and fail.

11. The method of claim 10, further comprising:
storing memory array output with a plurality of page buffer output bits of a page buffer, the plurality of page buffer output bits providing bit statuses of a plurality of bit lines to the plurality of status elements, the bit statuses indicating one of at least pass and fail of corresponding ones of the plurality of bit lines coupled to the plurality of status elements.

12. The method of claim 10, further comprising:
determining initial contents of the corresponding counting status memory elements from corresponding page buffer output bits of a page buffer.

13. The method of claim 10,
wherein each of the plurality of counting status circuits includes one of the plurality of status elements.

14. The method of claim 10, further comprising:
indicating one of at least pass and fail of one of a plurality of bit lines coupled to the plurality of status elements, with a bit status in one of the plurality of status elements.

15. The method of claim 10,
interrupting said processing of the plurality of counting status circuits in the sequential order, from proceeding further in the sequential order, responsive to one of the plurality of counting status circuits having the corresponding counting status memory element which indicates that a bit status of at least one of the plurality of status elements has not been counted in the total of the plurality of status elements that store the bit status.

16. The method of claim 15,
after said processing of the plurality of counting status circuits in the sequential order is interrupted, and before subsequent processing of the plurality of counting status circuits in the sequential order from a beginning of the sequential order, changing contents of the corresponding counting status memory element, to indicate that a bit status of at least one of the plurality of status elements has been counted in the total of the plurality of status elements that store the bit status.

17. The method of claim 10, successfully proceeding through all of the sequential order, with said processing of the plurality of counting status circuits in the sequential order, responsive to none of the plurality of counting status circuits having the corresponding counting status memory element which indicates that a bit status of at least one of the plurality of status elements has not been counted in the total of the plurality of memory elements that store the bit status.

18. A detecting circuit, comprising:

means for processing a plurality of counting status circuits in a sequential order to determine a total of a plurality of status elements, the plurality of counting status circuits electrically coupled to each other in the sequential order, wherein the plurality of counting status circuits receive data from corresponding ones of the plurality of status elements; and wherein the plurality of counting status circuits have corresponding counting status memory elements, the corresponding counting status memory elements indicating whether bit statuses of the plurality of status elements have been counted in the total of the plurality of status elements that store the bit statuses, the bit statuses indicating one of at least pass and fail of corresponding ones of a plurality of bit lines coupled to the plurality of status elements.

\* \* \* \* \*